United States Patent
Prickett, Jr. et al.

[11] Patent Number: 5,856,944
[45] Date of Patent: Jan. 5, 1999

[54] SELF-CONVERGING OVER-ERASE REPAIR METHOD FOR FLASH EPROM

[75] Inventors: Bruce L. Prickett, Jr.; Ritu Shrivastava, both of Fremont, Calif.

[73] Assignee: Alliance Semiconductor Corporation, San Jose, Calif.

[21] Appl. No.: 556,402

[22] Filed: Nov. 13, 1995

[51] Int. Cl.[6] ............................................. G11C 7/00
[52] U.S. Cl. ........................... 365/185.29; 365/185.22; 365/185.3; 365/185.33
[58] Field of Search .................... 365/185.29, 185.3, 365/183.33, 185.22, 218

[56] References Cited

U.S. PATENT DOCUMENTS

| | | | |
|---|---|---|---|
| 4,875,188 | 10/1989 | Jungroth | 365/185 |
| 5,122,985 | 6/1992 | Santin | 365/185 |
| 5,132,935 | 7/1992 | Ashmore, Jr. | 365/185 |
| 5,223,562 | 6/1993 | Ong et al. | 365/218 |
| 5,237,535 | 8/1993 | Mielke et al. | 365/185.3 |
| 5,295,107 | 3/1994 | Okazawa et al. | 365/218 |
| 5,416,738 | 5/1995 | Shrivastava | 365/185 |
| 5,424,991 | 6/1995 | Hu | 365/218 |
| 5,424,993 | 6/1995 | Lee et al. | 365/185.26 |

OTHER PUBLICATIONS

Yamada et al., "A Self–Convergence Erasing Scheme for a Simple Stacked Gate Flash EEPROM", IEDM, pp. 307–310, 1991.

*Primary Examiner*—David C. Nelms
*Assistant Examiner*—Son T. Dinh
*Attorney, Agent, or Firm*—Bradley T. Sako

[57] ABSTRACT

A method of repairing over-erased flash EPROM cells (10) includes erasing the cells (12) and repairing the cells by a self-converging repair with a control gate bias (14), on a column by column basis. The self-converging repair includes grounding the sources (104) of the cells in a column, applying a pulsed bias voltage to the control gates of the cells (110), and a pulsed positive voltage to the drains of the cells (106). By varying the bias voltage at the control gate, the resulting threshold voltage of the cells after repair can be modulated to be greater than or less than an inherent steady state convergence value. Once one column of cells is repaired, the process is repeated on a subsequent column.

24 Claims, 5 Drawing Sheets

SELF-CONVERGING OVER-ERASE REPAIR METHOD FOR FLASH EPROM

TECHNICAL FIELD

The present invention relates generally to "flash" erasable programmable read only memories (EPROMs), and more particularly to methods of repairing over-erased cells in flash EPROMs.

BACKGROUND OF THE INVENTION

"Flash" erasable programmable read only memories (EPROMs) derive their name from the manner in which they are erased. Flash EPROMs are typically designed with a number of cells having a common source, allowing the cells to be erased simultaneously by Fowler-Norheim tunneling, via their sources. Erase is typically accomplished by applying a positive voltage to the source relative to the control gate.

During operation of flash EPROMs, selected cells are read by applying a "select" voltage to the control gate of the cells. In most flash memory organizations, each row of cells includes a common control gate. At the same time a row to be read is selected, rows that are not read have a "de-select" voltage applied to the control gate of their respective cells. Proper operation of the flash cells requires that programmed cells remain off when selected, and erased (non-programmed) cells be turned on when selected. The current provided by a selected, erased cell is often referred to as the "read current." In addition, all cells, whether programmed or not, must remain turned off when de-selected. A vexing problem associated with flash EPROMs is that of "over-erase." Over-erase occurs when a cell's threshold voltage is lowered during an erase operation to the point where it cannot be sufficiently turned off when de-selected.

The causes of, and some solutions to, the over-erase problem are set forth in commonly-owned U.S. Pat. No. 5,416,738 issued on May 16, 1995 to Ritu Shrivastava. Included within Shrivastava is a flash EPROM method utilizing a negative read de-select voltage. The negative read de-select voltage "captures" a range of over-erased cells, by allowing some over-erased cells to be turned off when de-selected.

Attention is further directed to the review of flash EPROMs and "conventional" EEPROMs also set forth in Shrivastava.

A converging erase scheme is described in "A Self-Convergence Erasing Scheme for a Simple Stacked Gate Flash EEPROM," in *IEDM*, pp. 307–310, (1991) by Yamada et al. Yamada et al. discusses the property of erase convergence. Erase convergence occurs when a positive voltage is applied to the source of a flash EPROM cell, and the control gate and drain of the cell are grounded. Yamada et al. shows that the threshold voltage will converge on a "steady-state" threshold voltage (referred to as Vtss herein). The convergence phenomena occurs in those cases where the threshold voltage (Vt) of the cell is less than the cell's ultra-violet erased threshold voltage (Vt-uv), and includes cells having a Vt greater than or less than Vtss. As Vtss is dependent upon Vt-uv, Yamada et al. suggests using channel doping to control Vtss.

U.S. Pat. No. 5,233,562 issued to Ong et al. on Aug. 3, 1991, describes a flash EPROM cell repair scheme using the convergence property to repair over-erased cells. In a drain disturb repair, the control gate and source of a cell are grounded, while a positive voltage is applied to the drain. Similarly, in a source disturb repair, the control gate and drain are grounded, while a positive voltage is applied to the source. In a gate disturb repair, the drain and source are grounded, and a positive voltage is applied to the gate.

Figure 1A:
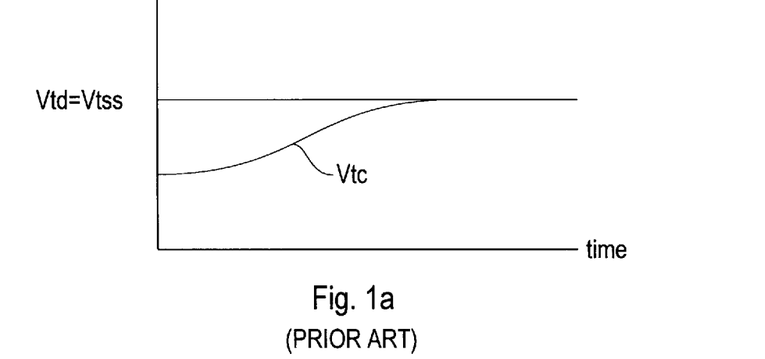
FIG. 1a is an illustration of a self-converging repair operation of the prior art for an over-erased flash cell wherein the steady-state convergence threshold voltage (Vtss) is equal to the desired erased cell threshold voltage (Vtd).
Figure 1B:
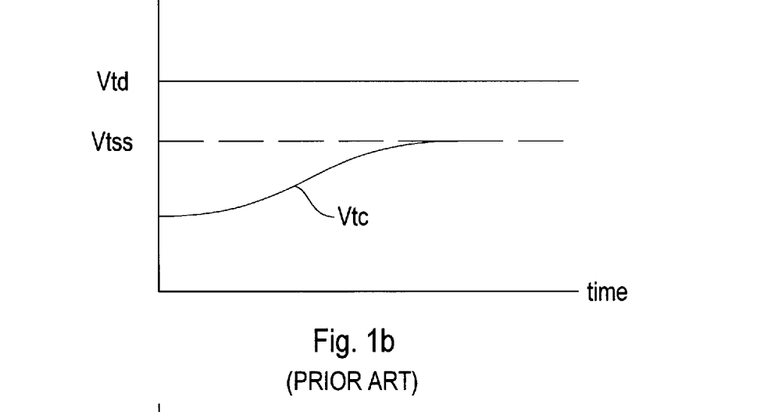
FIG. 1b is an illustration of the self-converging repair operation of the prior art for an over-erased flash cell wherein the Vtss less than Vtd.
Figure 1C:
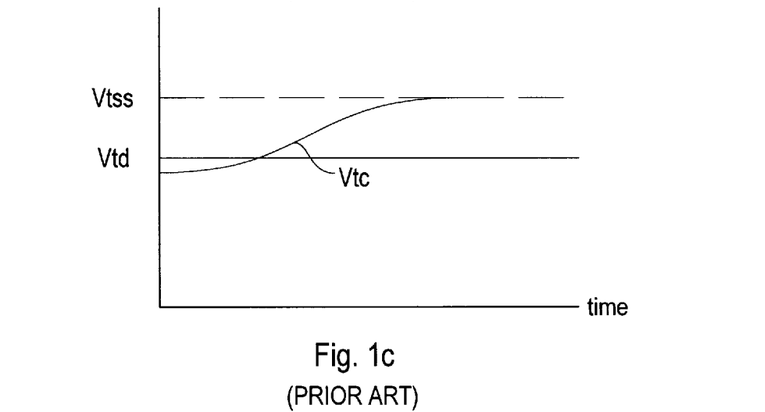
FIG. 1c is an illustration of the self-converging repair operation of the prior art for an over-erased flash cell wherein the Vtss is greater than Vtd.

Referring now to FIGS. 1a–1c, the drawbacks inherent in the above referenced prior art over-erase repair schemes are illustrated. FIG. 1a illustrates the ideal case where the desired erased cell threshold voltage (Vtd) is equal to the steady-state convergence threshold voltage, Vtss. In this case, prior art methods are effective in eliminating the over-erase problem. As shown in FIG. 1a, the over-erased cell threshold voltage (Vtc) begins in an over-erased condition (Vtc<Vtd). When the source and control gate are grounded, and a positive voltage applied to the drain, the Vtc converges to Vtss. Because in this ideal case Vtss=Vtd, the cell's final erased threshold voltage is Vtd, and the cell operates within desired parameters.

FIG. 1b illustrates a non-ideal case where prior art converging over-erase repair methods are not effective. As set forth in the figure, for this case, Vtss is less than Vtd. Variations between Vtss and Vtd can result from fabrication process variation. As a result, after over-erase repair, the cell's Vtc remains below Vtd, and the "repaired" cell essentially remains over-erased. Shrivastava, referred to above, teaches a read biasing condition wherein the de-select voltage is negative, thus maintaining over-erased cells in a non-conducting state. Further, commonly owned U.S. Pat. No. 5,513,147, entitled ROW DRIVING CIRCUIT FOR FLASH MEMORIES, issued to Bruce L. Prickett. Jr. on Apr. 30, 1996 and incorporated by reference herein, teaches a wordline driving circuit for providing a negative read de-select voltage.

FIG. 1c illustrates a second non-ideal case where Vtss is greater than Vtd. In this case, after repair, the over-erased cell has a Vtc that is above Vtd. It is "soft-programmed." To counter-act such a result, an iterative and/or slower repair approach is required. This adds to the amount of time required to properly erase the cells.

Figure 1D:
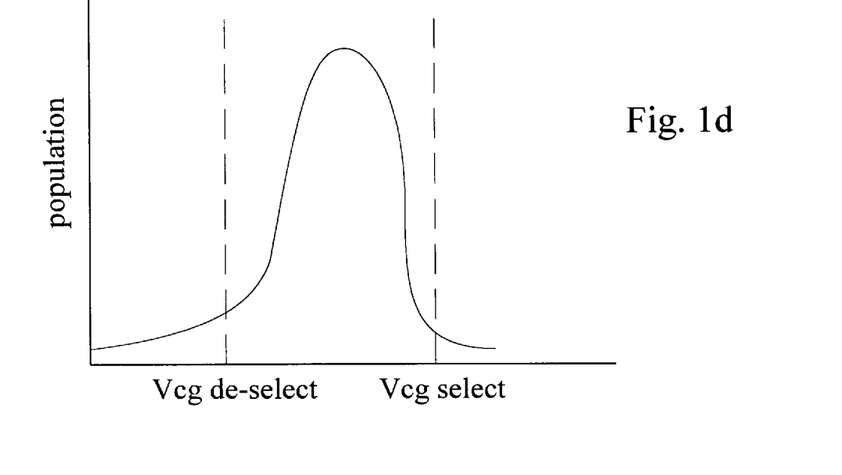
FIG. 1d is a graph illustrating a typical distribution of threshold voltages for flash cells after an erase operation.

FIG. 1d illustrates the distribution of erased threshold voltages (Vte) in a flash device. Also set forth in the diagram are representations of the control gate read select voltage (Vcg select) and de-select voltage (Vcg de-select). Those cells falling well between Vcg select and Vcg de-select will provide proper device operation. Those cells falling below Vcg de-select (commonly called "tail" cells) will not be sufficiently turned off when de-selected.

U.S. Pat. No. 5,424,991 issued to Genda Hu on Jun. 13, 1995 discloses a floating gate memory with a uniformly erased threshold voltage. According to the '991 patent, the cells of an array are first programmed and then erased to a threshold voltage below a desired threshold voltage. The threshold voltages of the cells are then "equalized" to the desired threshold voltage by the application of an equalization voltage to the control gates of the cells. A drawback to the Hu invention is that unless the cells are initially erased to a voltage that is close to the desired threshold voltage, large amounts of current are drawn during the equalization steps. Further, simultaneous equalization of multiple bit lines can result in non-uniform threshold voltages due to variations in the source resistance of bit lines, this is particularly true if large amounts of current are drawn during equalization.

Clearly it would be desirable to provide an over-erase method that addresses the problems set forth above.

SUMMARY OF THE INVENTION

It is an object of the present invention to provide a method of repairing over-erased flash EPROM cells that provides for a wide range of set points in the steady-state convergence threshold voltage (Vtss) of the cells.

It is another object of the present invention to provide a method of repairing over-erased flash EPROM cells that allows for an adjustable cell threshold voltage after over-erase repair.

It is another object of the present invention to provide a method of repairing over-erased flash EPROM cells that does not consume large amounts of current during the repair operation.

It is another object of the present invention to provide a method of repairing over-erased flash EPROM cells that provides a uniform cell threshold voltage between bit lines.

According to the present invention, a self-converging over-erase repair procedure for a flash EPROM cell includes erasing the cells of an array, and then performing a verify erase operation on a single column of the array. In the event over-erased cells are detected on the column, the cells of the column are repaired by grounding the common sources of cells in the column, applying a bias voltage to the control gates of the cells, and applying a bias voltage to the drains of the cells. The bias voltage can be varied to alter the resulting erased cell threshold value of the cells.

According to another aspect of the present invention, a positive voltage is applied to the control gates of the cells in a column during a self-converging over-erase repair to create an erased cell threshold voltage in the column that is greater than the steady-state convergence threshold voltage of the cell.

According to another aspect of the present invention, a negative voltage is applied to the control gates of the cells in a column during a self-converging over-erase repair to create an erased cell threshold voltage in the column that is less than the steady-state convergence threshold voltage of the cell.

According to another aspect of the present invention an initial bias voltage is applied to the control gates of the cells in a column. The operation of the cells in the column is verified, and if cell current is unacceptably high when the cells are de-selected, the control gate bias voltage is increased, and reapplied to the control gates. Cell verification of the column, and increases in gate bias voltage are repeated until the over-erase condition is repaired.

An advantage of the present invention is that the erased cell threshold voltage of a flash EPROM device can be adjusted to an optimal value during over-erase repair.

Yet another advantage of the present invention is that it provides a method of repairing over-erased flash EPROM cells over a wide range of process variations.

Other objects and advantages of the invention will become apparent in light of the following description thereof.

DETAILED DESCRIPTION OF THE EMBODIMENTS

Figure 2:
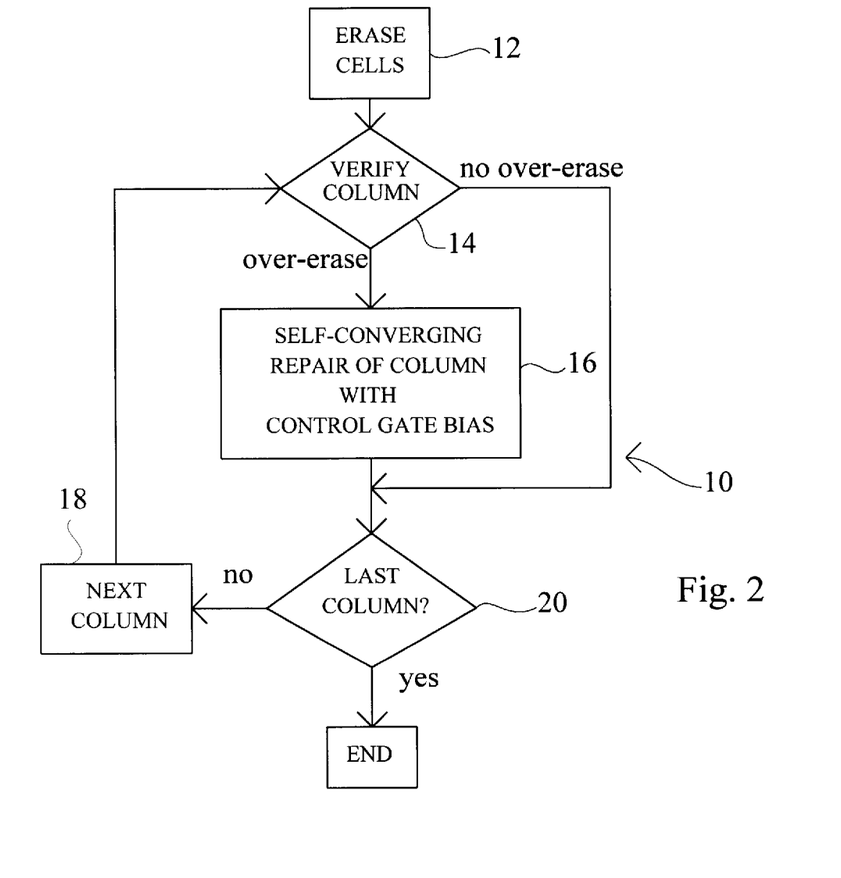
FIG. 2 is a flow chart illustrating an over-erase repair method according to a preferred embodiment of the present invention.

FIG. 2 illustrates, generally, a self-converging over-erase repair method 10 according to a preferred embodiment of the present invention. The embodiment of FIG. 2 is non-iterative and so provides a rapid and accurate over-erase repair. The repair method 10 includes erasing the cells of the device (step 12). The cells of a column are verified to check for proper operation (step 14). In the event over-erased cells are detected, the cells of the column are repaired by a self-converging repair with a control gate bias (step 16). The process then repeats with a next column (step 18), or concludes if it is the last column (step 20). Like the prior art, the repair step is self-converging and over-erased cells converge on a steady-state voltage. Unlike the prior art, the threshold voltage that the cells converge upon (an adjusted steady-state voltage, Vtss') is alterable, and not entirely process dependent. Also, because cell verification and repair occurs on a column-by-column basis, less current is drawn at any one time.

Figure 3A:
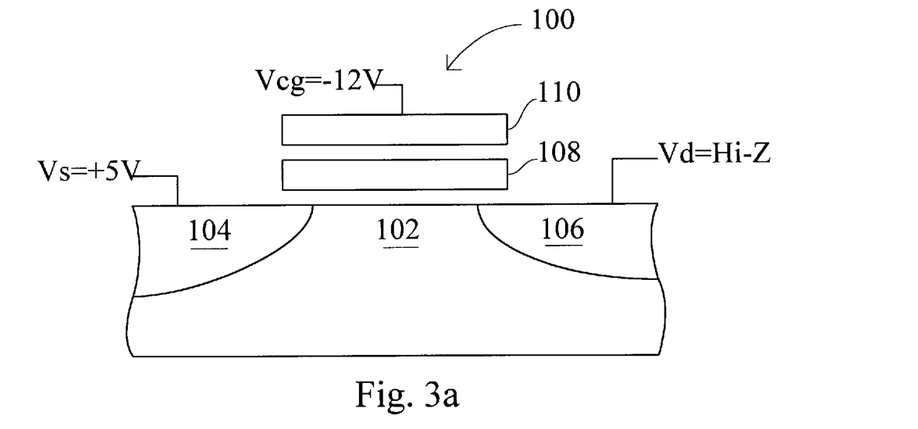
FIGS. 3a and 3b are side cross sectional views of a flash EPROM cell illustrating the biasing conditions of the embodiment set forth in FIG. 2.
Figure 3B:
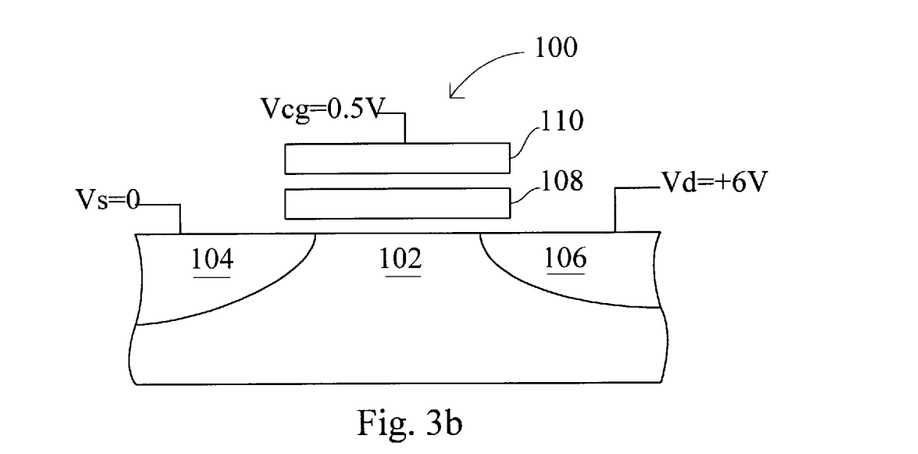

The various steps of the repair method described in FIG. 2 are best understood with reference to FIGS. 3a–3b. FIGS. 3a–3b are cross sectional representations of a flash EPROM cell that illustrate the biasing schemes of the erase operation (step 12) and the control gate bias repair (step 16) of a preferred embodiment of the present invention. According to well known designs, the flash EPROM cell 100 is set within a p-type substrate 102, and includes an n-type source 104, an n-type drain 106, a floating gate 108, and a control gate 110.

Referring now to FIG. 3a, in the preferred embodiment, the cells 100 are erased (step 12) by applying a source voltage of positive five volts (Vs=+5V), a control gate voltage of negative twelve volts (Vcg=−12V), and holding the drain 106 at a high impedance state (Vd=Hi−Z). It is understood that the particular erasing procedure set forth in FIG. 3a should not be construed as limiting the present invention thereto.

Cell verification (step 14) in a preferred embodiment includes read de-selecting the cells in a column, and comparing the resulting drain current(s) (Id) for the column, to a maximum allowable drain current value (Idmax). If Id is less than or equal to Idmax, all the cells in the column have been properly erased and repaired. If, however, Id is greater than Idmax, the cells of the column are repaired according to step 16. In a preferred embodiment, the Idmax is in the range of 10 $\mu A$.

Referring now to FIG. 3b, it is shown that in a preferred embodiment, an over-erased cell 100 is repaired by grounding the sources of the cells in the column (Vs=0V), and biasing the drains at positive six volts (Vd=+6V). Unlike the self-converging erase and repair schemes of the prior art, according to the present invention the control gate 110 is not grounded. Contrarily, the control gate 110 is biased at a convergence bias voltage (Vbias). Further, repair is conducted on only a single column at a time.

In a preferred embodiment, Vbias is selected to be the difference between the steady-state convergence threshold voltage, Vtss, as previously described above, and the desired erased cell threshold voltage, Vtd, also described above. For the flash EPROM cell of FIG. 3b, Vtss (which is dependent upon the process) is equal to 0V. The desired threshold value for an erased cell is 1.0 V. Accordingly, Vcg=Vbias=(Vtd−Vtss)=+1.0V and six volts is applied to the drain. It is understood that the repair procedure is accomplished by a relatively short (~5 ms) pulse application of the Vbias to the control gate, and a pulse application (~4 ms) of the +6 volt drain voltage.

Figure 4:
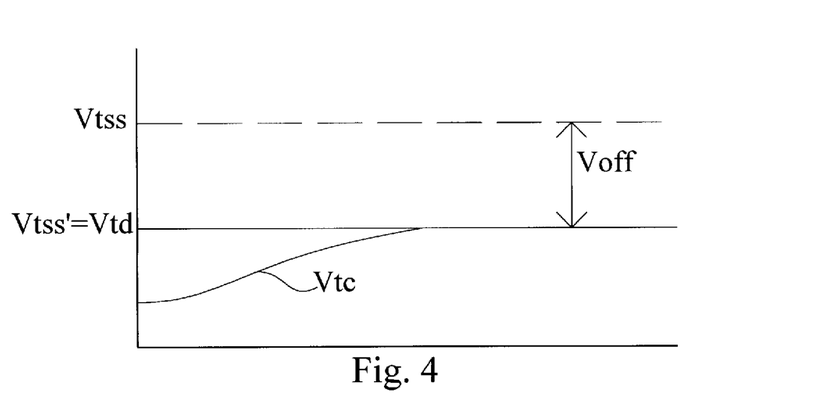
FIG. 4 is a graph illustrating the repair of an over-erased cell according to the embodiment set forth in FIG. 2.

The effect of Vbias on the over-erase repair method 10 is best understood with reference to FIG. 4. With the application of Vbias to the control gate 110, the over-erased cell's threshold voltage, Vtc, does not converge on Vtss (as in the prior art), but rather upon an adjusted convergence threshold voltage (Vtss'), where Vtss'≈Vtss+Vbias. In this manner, the present invention provides a self-converging over-erase repair scheme that is not dependent upon process parameters alone, but can be set arbitrarily. In the event a memory device is fabricated with cells having a Vtss that is greater than or less than a desired erase threshold voltage, Vtd, the threshold voltages of the cells can be brought to converge on a Vtss' that is equal to Vtd, by applying a bias voltage (either positive or negative) to the control gate 110 during self-converging repair.

It is noted that if the cell verification (step 14) portion of the method set forth in FIG. 2 requires too much time, or for other reasons faster erase times are desired, the verification step can be eliminated. For such a case, the cells are erased (step 12) and then repaired according to step 16. Such a "blind" repair variation of the present invention is particularly useful in cases where cell operation is well characterized and little process variation is anticipated. By limiting repair to single columns at one time, the risk of drawing inordinate amounts of current present in prior art approaches is eliminated.

Figure 5:
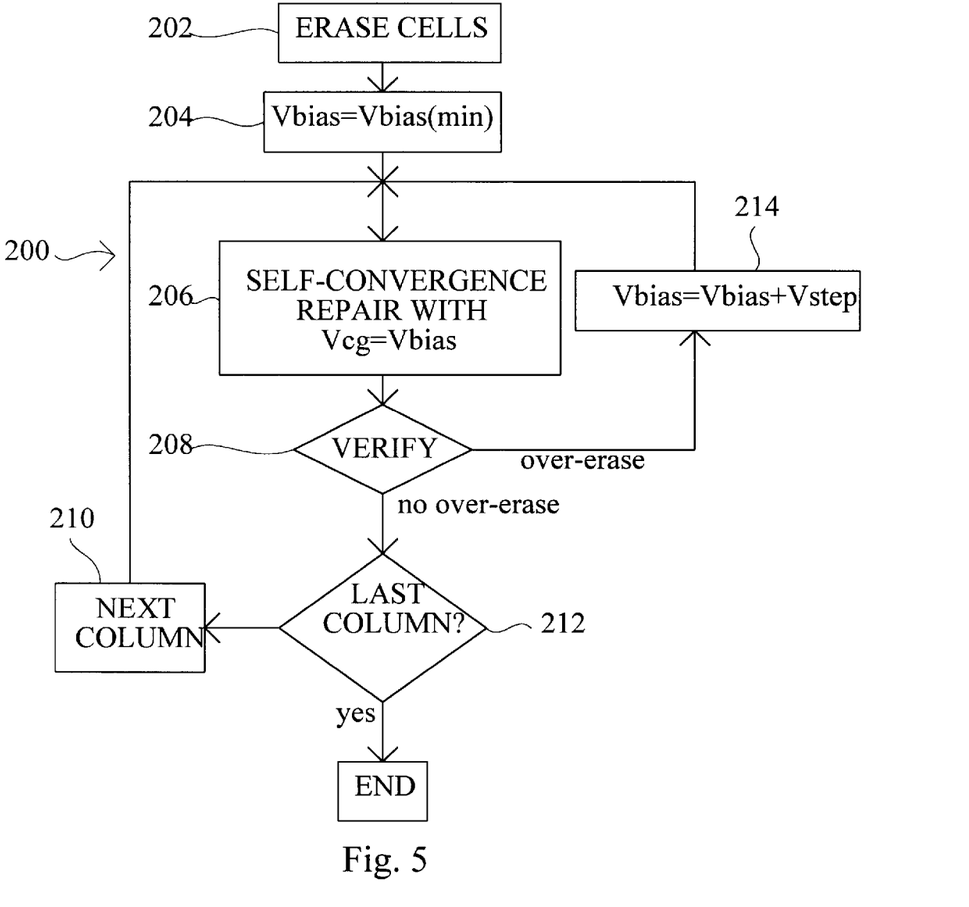
FIG. 5 is a flow chart illustrating an over-erase repair method according to an alternate embodiment of the present invention.

One skilled in the art would recognize that the preferred embodiment 10 is dependent upon knowing the steady-state convergence threshold voltage (Vtss) of the cell in order to arrive at a Vbias value. An alternate embodiment, set forth in FIG. 5, is less dependent upon having exact Vtss values for implementing over-erase repair.

The alternate embodiment of the present invention is an iterative repair method, and is designated by the general reference character 200. Like the preferred embodiment 10 of FIG. 2, the alternate embodiment 200 includes erasing the flash EPROM cells (step 202). The bias voltage for the control gate, Vbias, is set to a minimum value (Vbias$_{(min)}$) (step 204). The cells in a column are subject to a self-converging repair step with an initial Vbias=Vbias$_{(min)}$ applied to the cell control gates (step 206). Cell operation for the column is verified for any over-erased cells (step 208). As is shown in the figure, if all of the cells of the column operate properly (no over-erase is detected) the process concludes for the current column, and either moves on to a subsequent column (step 210), or in the case of the last column (step 212), concludes entirely. In the event over-erase cells are detected, Vbias is increased by a step in voltage (Vstep) (step 214). Steps 206 and step 208 are then repeated. In this fashion, the threshold voltages of the cells converge on increasingly higher adjusted convergence threshold voltages, Vtss', until proper erased cell operation is achieved.

Initial cell erasure (step 202) is identical to step 12 of the preferred embodiment. Accordingly, this step will not be discussed in detail. It is understood however, that the particular way in which the cells are initially erased should not be construed as limiting.

The selection of Vbias$_{(min)}$ in the alternate embodiment (step 204) sets the initial adjusted convergence threshold voltage to a minimum value (Vtss0') that is in the range of the minimum read de-select voltage. In the alternate embodiment 200, the worst case expected Vtss is +1V. That is, taking into account process variability, the highest expected steady-state convergence threshold voltage (with no control gate bias) is positive one volt (+1V). In addition, the alternate embodiment employs a read de-select voltage of negative two volts (−2V). Accordingly, to assure a minimum adjusted convergence threshold voltage (Vtss0') that has an acceptable voltage margin with respect to the minimum de-select voltage, Vbias$_{(min)}$ is −2.5V.

The cell repair biasing scheme of the alternate embodiment (step 206) follows that of the preferred embodiment 10, except for the value of Vbias. Accordingly, cells that are repaired have a drain voltage of six volts (Vd=+6V), with sources grounded (Vs=0V). The control gate voltage is Vbias, which as discussed above, is initially set to Vbias$_{(min)}$ (−2.5V). The control gate voltage, Vcg, is a pulse having a duration in the order of ~5 ms. In addition, the drain is pulsed as well, in the order of 4 ms.

Cell verification (step 208) according to the alternate embodiment is is the same as the preferred embodiment (step 14). In the event that cell verification (step 208) indicates that the preceding cell repair (step 206) is not successful, the increase of Vbias (step 210) is accomplished in the alternate embodiment, by increasing Vbias by a positive one half volt (Vstep=+0.5V).

Figure 6:
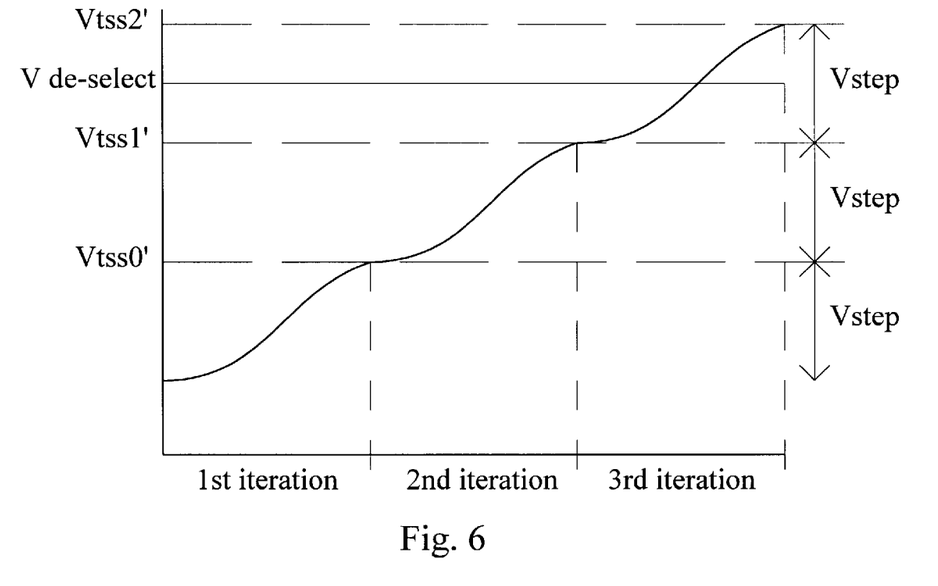
FIG. 6 is graph illustrating the repair of an over-erased cell according to the alternate embodiment set forth in FIG. 5.

Referring now to FIG. 6, the repair of an over-erased cell in a selected column according to the alternate embodiment is graphically illustrated. In the example of FIG. 6, following the initial cell repair (step 206) with a Vbias equal to Vbias$_{(min)}$ (−2.5V), the over-erased cell converges to the initial adjusted convergence threshold voltage Vtss0'. This is shown as a "first iteration" in FIG. 6. As shown in FIG. 6, Vtss0' remains below the desired threshold voltage (Vtd) and so the subsequent cell verification (step 208) indicates the over-erase condition.

In accordance with the method of FIG. 5, Vbias is increased by Vstep (step 210), and the cell repair (step 206) is repeated, but at a higher Vbias. Referring once again to FIG. 6, it is shown that the cell threshold voltage converges on a second adjusted convergence threshold voltage Vtss1' (where Vtss1'=Vtss0'+Vstep). This is shown as a "second iteration" in FIG. 6. As in the case of Vtss0', Vtss1' remains below the desired threshold voltage (Vtd). Cell verification (step 208) indicates over-erase and the bias voltage is increased a second time (step 210).

In response to the second increase in Vbias, the cell threshold voltage converges on a third adjusted convergence threshold voltage Vtss2' (where Vtss2'=Vtss0'+2(Vstep)). This is shown as the "third iteration" in FIG. 6. Unlike Vtss0' and Vtss1', Vtss2' is greater than Vtd. Accordingly, the verify operation (step 208) indicates no over-erase, and the iterative repair procedure of the alternate embodiment ends.

It is understood that this iterative approach could be used in a "blind" repair operation (i.e. no verification step). In such a case Vbias could start at a minimum voltage, and then be incremented a set amount of times. This approach minimizes the amount of current drawn at any one time during a "blind" repair.

While cell verification (step 208) in the alternate embodiment includes applying a read de-select condition to the cells, one skilled in the art would recognize that this step could further include cell operation optimization. By allowing the Vbias adjustment operation (step 210) to include both positive and negative Vstep values, erased cell threshold voltages Vtc, can be raised and/or lowered to arrive at an optimal value for read speed and/or read current.

It is understood that cell threshold voltages can be lowered by either using the self-converging erase with a control gate bias directly, or by purposefully over-erasing the cells, and then using the self-converging method set forth herein to raise the threshold voltages to the optimum level.

An advantage of the alternate embodiment of the present invention is that by beginning with a minimum control gate Vbias value, and incrementally increasing Vbias, the amount of current required to effect self-converging repair during each iteration is minimized. By reducing repair current, the time required for convergence can be decreased.

It is also understood that, like the embodiment of FIG. 2, a variation of the alternate embodiment of FIG. 5 could include the elimination of the cell verification portion of the method (step 208). Such a "blind iterative" method would be similar to the blind repair method described in conjunction with FIG. 2, except that the control gate bias voltage would be reached gradually, through a number of iterations. Such a variation of the present invention retains the distinct advantage of requiring less peak current than the non-iterative blind repair.

In the preferred embodiment, a column of cells are those cells that are commonly coupled to a single bit line. It is understood that a column could be represented by more than one bit line.

The invention has been described in connection with its preferred embodiments, and may be changed, and other embodiments derived, without departing from the spirit and scope of the invention. Accordingly, the above disclosure is not intended to be limiting and the appended claims are to be interpreted as encompassing the entire scope of the invention.

What we claim is:

1. In a flash electrically programmable read only memory (EPROM) device having a plurality of memory cells arranged in rows and columns, each memory cell having a first diffusion region, a second diffusion region, and a control gate, a method of repairing over-erased cells, comprising the steps of:

(a) flash erasing at least a column of cells;

(b) verifying the operation of the cells in the column;

(c) in the event at least one cell in the column is over-erased, repairing the cells by grounding the first diffusion regions of the cells in the column, applying a positive bias voltage to the second diffusion regions of the cells in the column, and applying a non-zero, offset bias voltage to the control gates of the cells in the column.

2. The method of claim 1 wherein:

the offset bias voltage is a positive voltage.

3. The method of claim 1 wherein:

the offset bias voltage is a negative voltage.

4. The method of claim 1 wherein:

the offset bias voltage is the difference between a desired erased threshold voltage and a steady-state convergence threshold voltage.

5. The method of claim 1 wherein:

the first diffusion regions are source regions that are commonly shared by a plurality of cells.

6. The method of claim 1 wherein:

the second diffusion regions are drain regions, the drain regions of a column of cells being commonly coupled to at least one bit line.

7. The method of claim 1 wherein:

the first diffusion regions are source regions and the second diffusion regions are drain regions, and step (a) includes applying a positive bias voltage to the source regions of the cells, a negative erase voltage the control gates of the cells, and holding the drain regions of the cells in a high impedance state.

8. The method of claim 7 wherein:

the positive bias voltage is approximately positive five volts and the negative erase voltage is approximately negative twelve volts.

9. The method of claim 1 further including:

prior to step (c), setting the offset bias voltage to a minimum offset bias voltage;

after step (c), the steps of
    (d) verifying the erase operation of the cells in the column to detect over-erased cells; and
    (e) if over-erased cells are detected in step (c), increasing the offset bias voltage and repeating step (b).

10. The method of claim 9 wherein:

the minimum offset bias voltage is approximately −2.5 volts.

11. The method of claim 9 wherein:

step (b) further includes detecting a deselect current value of the erased cells; and step (d) further includes making the offset bias voltage more positive if the deselect current values are greater than a maximum deselect current value.

12. The method of claim 9 further including:

prior to step (c), setting the offset bias voltage to a minimum offset bias voltage; and repeating step (c) a plurality of time, increasing the offset bias voltage each time.

13. In a flash electrically programmable read only memory (EPROMs) having a plurality of one transistor flash memory cells, each cell being coupled to a bit line by its drain and to a wordline by its control gate, a self-converging over-erase repair method, comprising the steps of:

testing at least one bit line for over-erased cells;

if an over-erased cell is detected in the one bit line, repairing the memory cells coupled to the bit line by coupling the sources of the memory cells coupled to the bit lines to ground, applying a bias voltage to the control gates of the memory cells, and applying a positive voltage to the bit line, and if no over-erased cells are detected in the one bit line, testing subsequent bit lines in the memory for over-erased cells, and repairing those bit lines having over-erased cells according to the above repair step.

14. The repair method of claim 13 wherein:

testing the bit line includes deselecting the memory cells commonly coupled to the bit line, and comparing the current of the bit line current with a predetermined maximum erase bit line current.

15. The repair method of claim 14 wherein:

deselecting the memory cells includes applying a negative voltage to control gates of the memory cells coupled to the bit line.

16. The repair method of claim 14 wherein:

the maximum erase bit line current is in the approximate range of one to one hundred microamperes (1–100 $\mu$A).

17. The repair method of claim 13 wherein:

the bias voltage is less than zero volts.

18. The repair method of claim 13 wherein:

the bias voltage is greater than zero volts.

19. The repair method of claim 18 wherein:

the bias voltage is voltage is approximately −2.5 volts.

20. In a flash electrically programmable read only memory (EPROMs) having a plurality of memory cells arranged in an array of rows and columns, each cell having a source, a drain, and a control gate, wherein the sources of the cells in the array are commonly coupled to a source node, the drains of the cells in a column are commonly coupled to a bit line, and the control gates of the cells in a row are commonly coupled to a word line, a method of flash erasing, comprising the steps of:

(a) erasing the cells in the array;

(b) selecting a column of cells by coupling the bit line of the column to a current sensing circuit, applying a deselect voltage to the control gate of each cell in the selected column, and coupling the source node to a common first source voltage;

(c) comparing the current in the bit line to a maximum leakage current;

(d) if the current in the bit line is greater than the maximum leakage current, repairing the cells in the column by coupling the bit line to a first drain bias voltage and the control gates of the cells in the column to a converge repair voltage, and then repeating step (c); and (e) if the current in the bit line is less than the maximum leakage current, repeating the above method beginning with step (b) on the remainder of the columns until all the cells in the entire array are repaired.

21. The method of claim 20 wherein:

step (b) includes activating a gate circuit intermediate the bit line and the current sensing circuit.

22. The method of claim 20 wherein:

the deselect voltage of step (b) is less than zero.

23. The method of claim 20 wherein:

the first source voltage of step (b) is zero volts (ground).

24. The method of claim 20 wherein:

step (d) includes repairing the cells of the column with an initial converge repair voltage, and increasing the value of the converge repair voltage each time the bit line current is greater than the maximum leakage current.

* * * * *